United States Patent
Juneja

(12) 
(10) Patent No.: US 6,452,262 B1
(45) Date of Patent: Sep. 17, 2002

(54) LAYOUT OF VDD AND VSS BALLS IN A FOUR LAYER PBGA

(75) Inventor: Nitin Juneja, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/781,866

(22) Filed: Feb. 12, 2001

(51) Int. Cl.⁷ .............................................. H01L 23/52
(52) U.S. Cl. ..................... 257/691; 251/744; 251/773; 251/784; 251/780; 251/779; 251/738
(58) Field of Search ................................ 257/691, 774, 257/773, 784, 780, 779, 738, 668

(56) References Cited

U.S. PATENT DOCUMENTS

| | | | |
|---|---|---|---|
| 5,640,048 A | * 6/1997 | Selna | 257/738 |
| 5,714,801 A | * 2/1998 | Yano et al. | 257/691 |
| 6,057,596 A | * 5/2000 | Lin et al. | 257/697 |
| 6,064,113 A | * 5/2000 | Kirkman | 257/691 |
| 6,225,702 B1 | * 5/2001 | Nakamura | 257/786 |

\* cited by examiner

*Primary Examiner*—Albert W. Paladini
*Assistant Examiner*—Luan Thai
(74) *Attorney, Agent, or Firm*—Trexler, Bushnell, Giangiorgi, Blackstone & Marr Ltd.

(57) ABSTRACT

A BGA package wherein power is provided to the die through power (Vdd) balls which are located in an inner most row of solder balls. By arranging the power balls in an inner most row, it is possible to reduce the distance the electrical signal has to travel to reach a power ring. Preferably, ground is provided to the die through ground (Vss) balls which are dispersed in a ball field around the periphery of the inner most row of power balls. Preferably, the ground balls are paired together, because by pairing the ground balls, it is possible to use only one via for two ground balls on the system board. This reduces the number of layers needed on the system board to route all of the pins and may make it possible, for example, to route more traces on the system board.

11 Claims, 5 Drawing Sheets

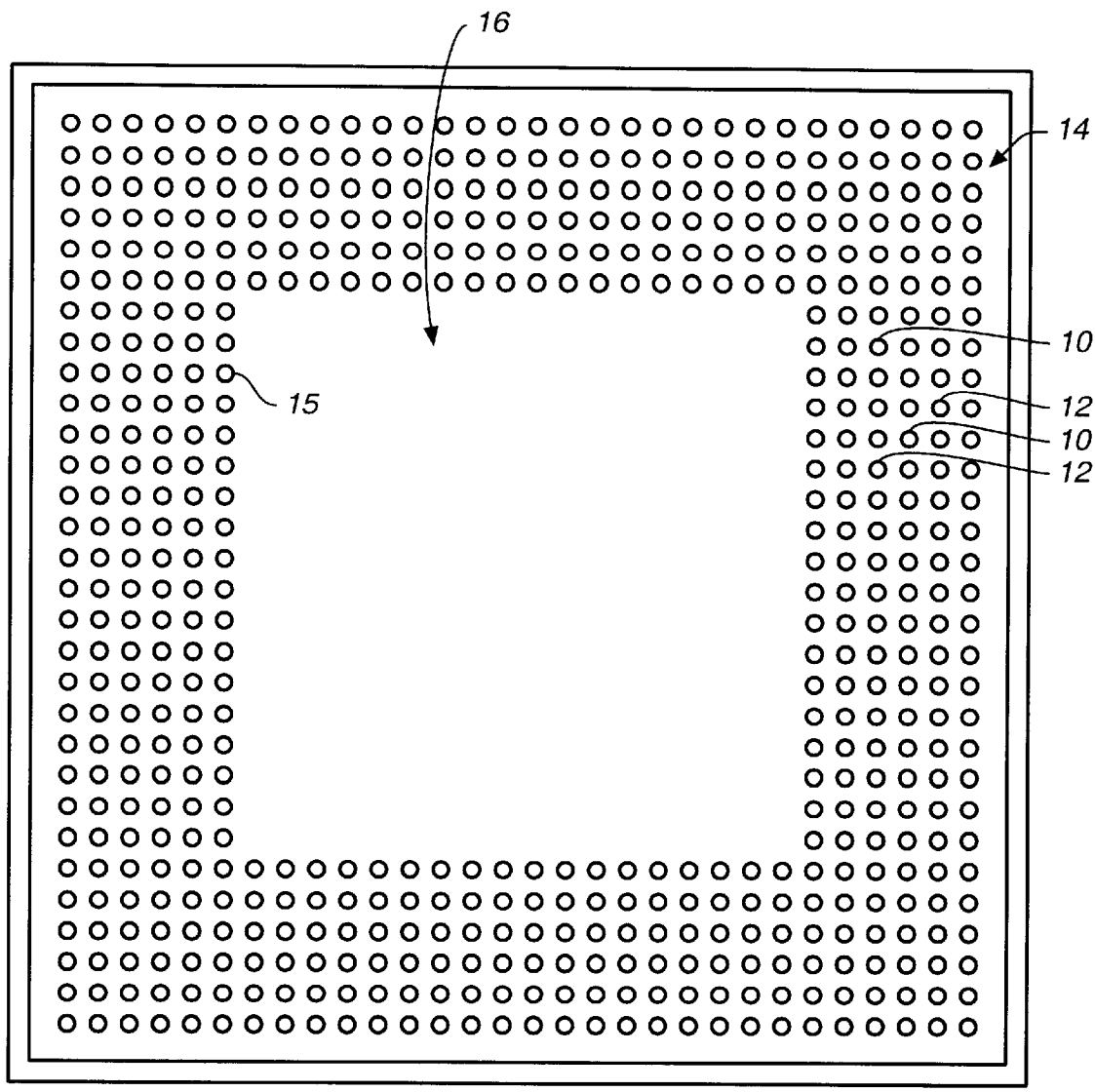
FIG._1
*(PRIOR ART)*

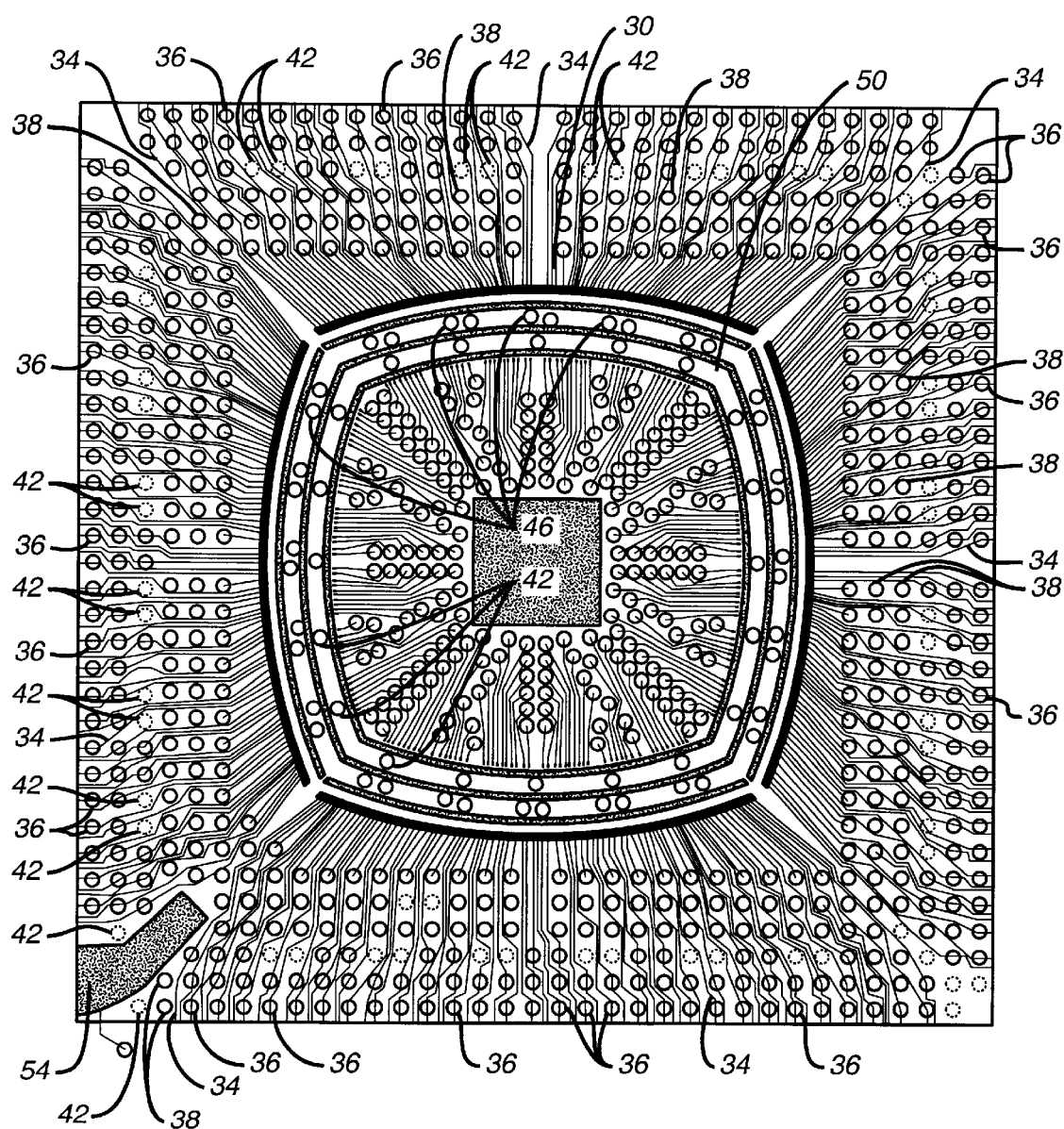
FIG._2

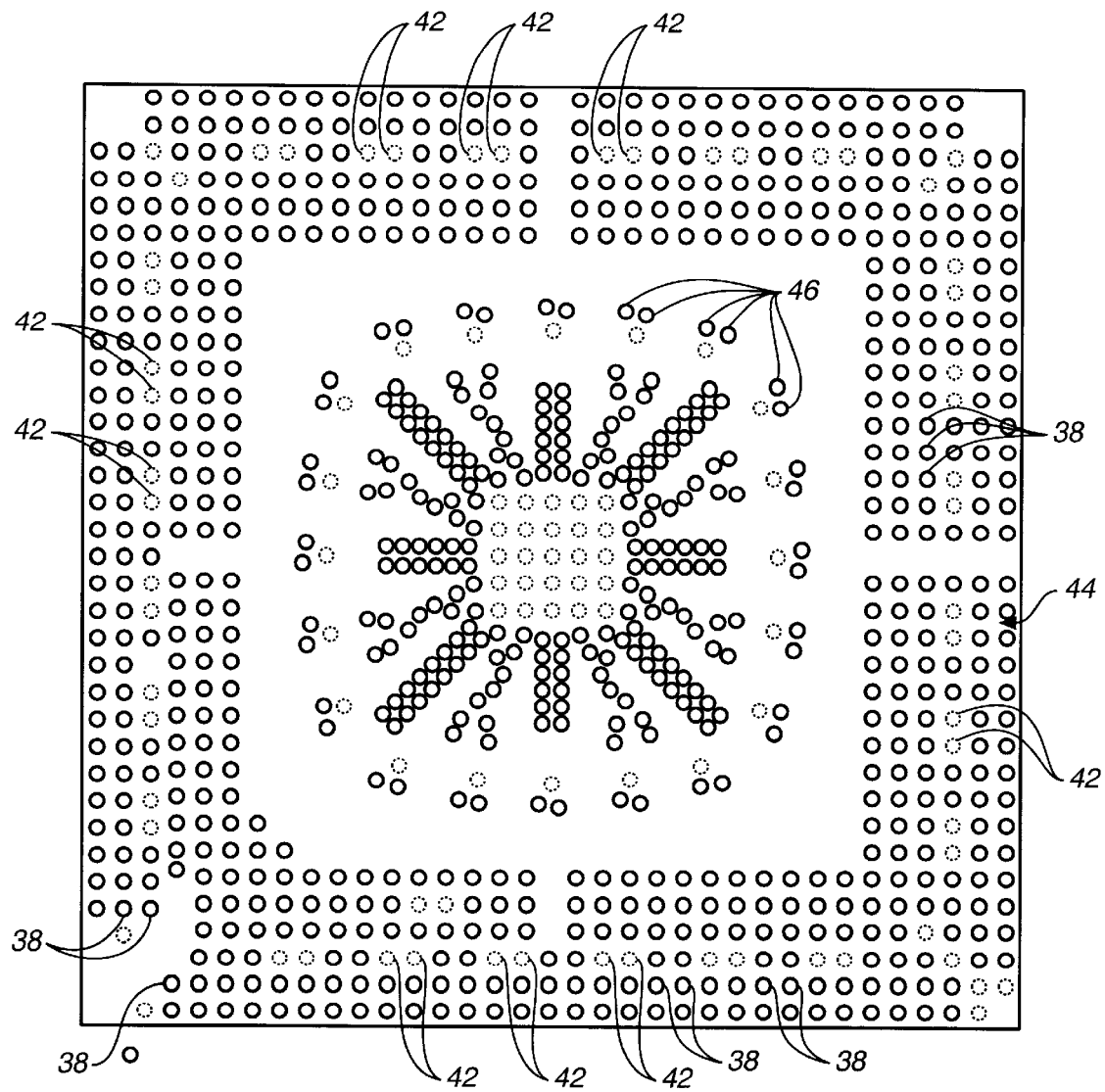
FIG._3

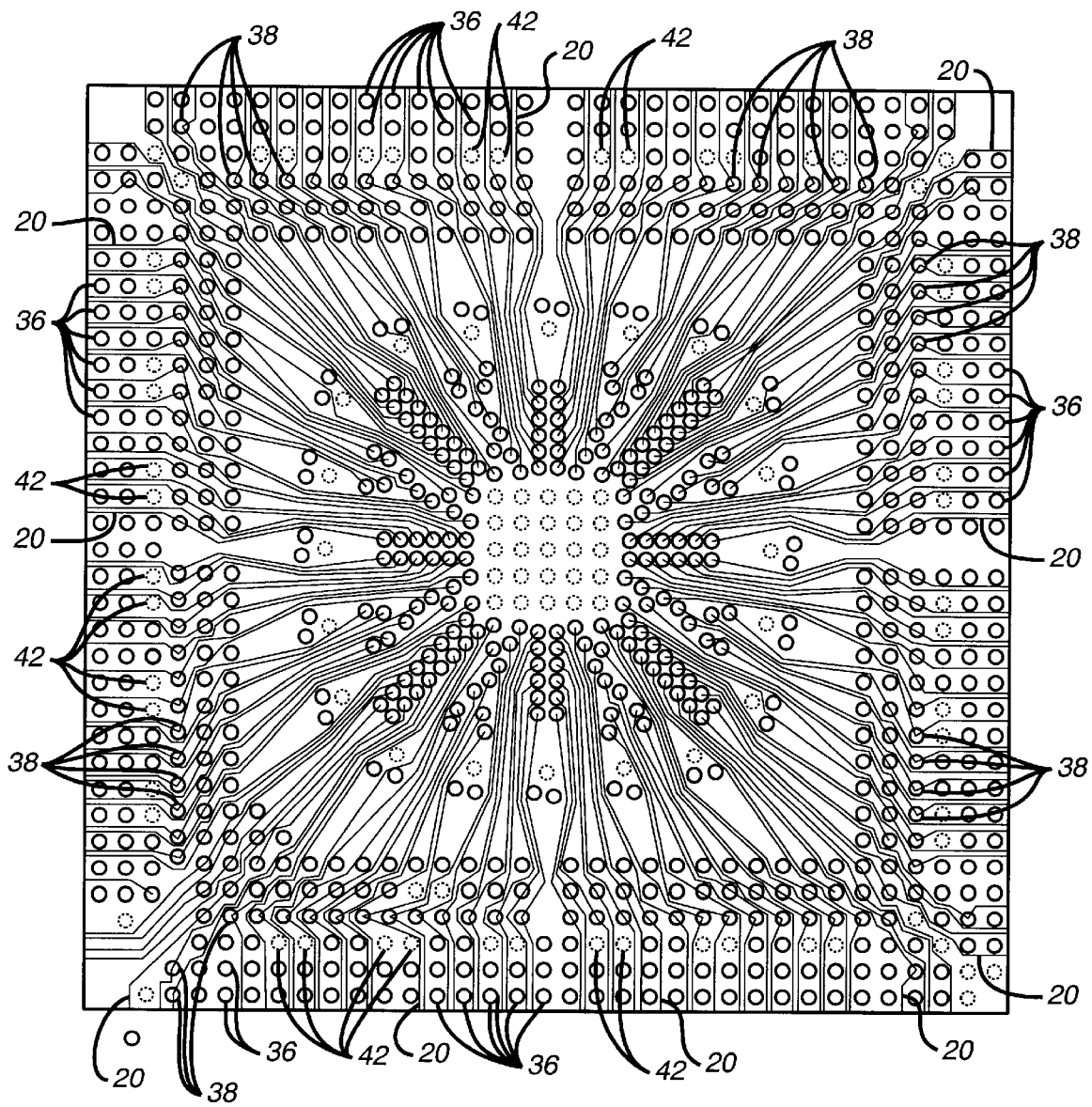
FIG._4

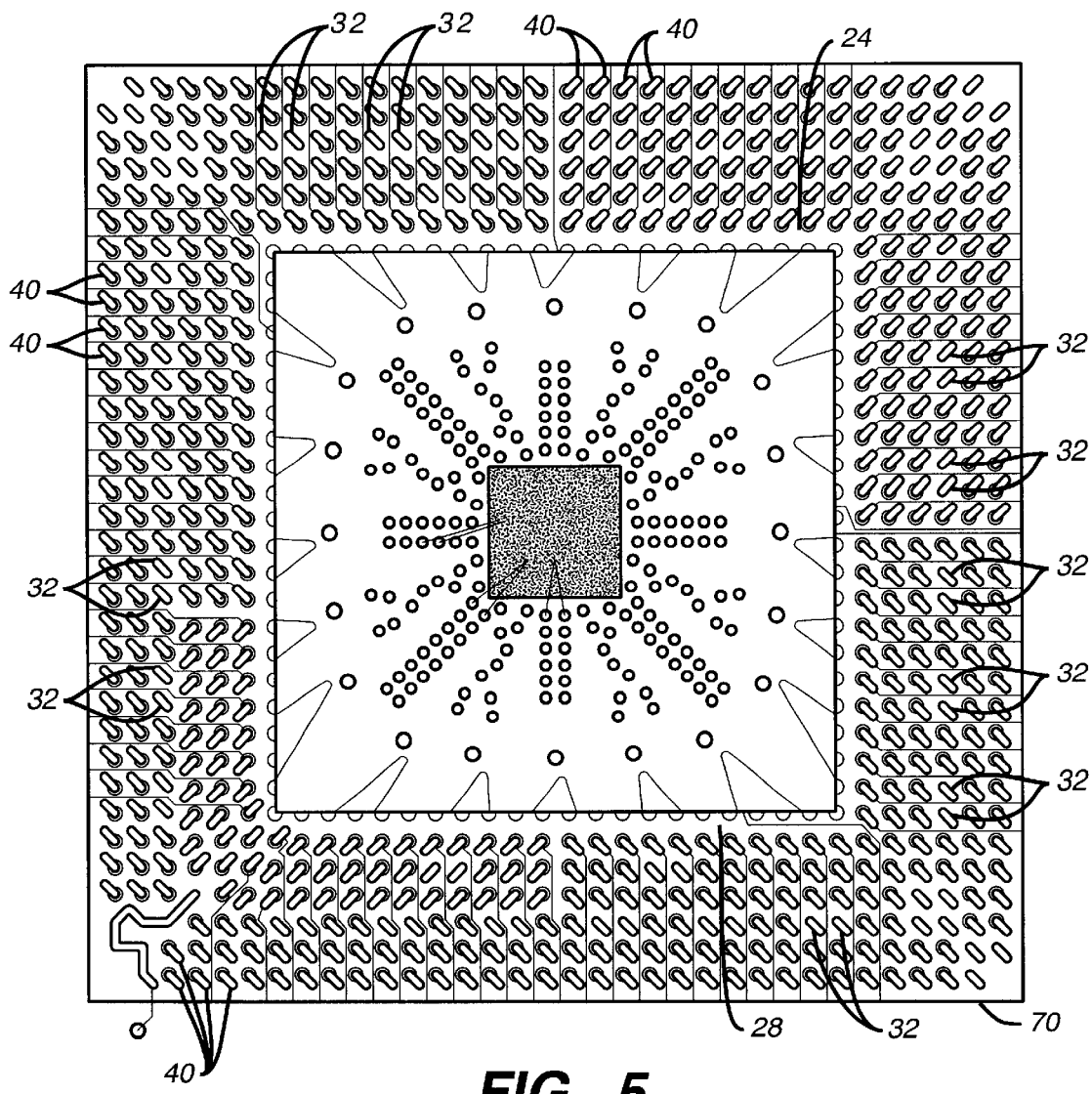
FIG._5

LAYOUT OF VDD AND VSS BALLS IN A FOUR LAYER PBGA

BACKGROUND

This invention generally relates to Ball Grid Array (BGA) packages, and more specifically relates to a new scheme of laying out Vdd (power) and Vss (ground) balls in a four layer BGA package to provide certain advantages over prior art four layer BGA package designs.

An integrated circuit package provides electrical connection from an integrated circuit chip or die to external electrical connections. These external electrical connections may be, for example, connections on a system board or printed circuit board. A Ball Grid Array (BGA) package is one type of integrated circuit package which has become increasingly popular, particularly because, among other benefits, it allows a high density of external connections. BGA technology is a surface mount package technology that uses an array of solder balls to make electrical contact with the system circuit board, as opposed to pins or peripheral leads.

One type of BGA package is a four layer BGA package. A typical four layer BGA package is configured such that layer 1 is a signal layer, layer 2 is a ground layer, layer 3 is a power layer and layer 4 is another signal layer. The signal layers (layers 1 and 4) provide various signal lines or traces while the ground layer (layer 2) and power layer (layer 3) provide a ground plane and a power plane, respectively, each of which is typically formed of a conductive metal, such as copper. While power (Vdd) balls provide electrical paths for providing power from the system board to the die, ground (Vss) balls provide electrical paths for providing ground from the system board to the die.

FIG. 1 illustrates a typical pattern for laying out the power balls 10 and ground balls 12 in a four layer BGA package. As shown, the power balls 10 and ground balls 12 are interspersed in a ball field 14 (with signal balls 15) around the die 16. The power balls 10 are connected to the power plane (on layer 3) through vias, and the ground balls 12 are connected to the ground plane (on layer 2) through vias. The planes help reduce the inductance of the Vdd and Vss in the package by providing a copper sheet where the current can flow without any obstructions. In fact, in a typical four layer BGA package design, it is essential that a power plane and ground plane be provided in the package to reduce the inductance of the Vss and Vdd paths. Because a power plane must be provided, and is typically provided on layer 3 of a typical four layer BGA package, real estate is consumed in the package that could otherwise be used for routing and for IO's. Additionally, as shown in FIG. 1, a typical four layer BGA package provides that ground balls 12 are spaced apart and not paired. As a result of this arrangement, the number of layers which are needed on the system board to route all the pins is not minimized.

OBJECTS AND SUMMARY

A general object of an embodiment of the present invention is to provide a new scheme for laying out the power (Vdd) balls and ground (Vss) balls in a four layer BGA package.

Another object of an embodiment of the present invention is to eliminate the use of the power plane in a four layer BGA package, thereby providing additional real estate for routing traces and allowing additional IO's to be provided.

Still another object of an embodiment of the present invention is to provide a layout of ground (Vss) balls in a BGA package which reduces the number of layers needed on the system board to route out all the pins.

Briefly, and in accordance with at least one of the foregoing objects, an embodiment of the present invention provides a BGA package wherein power is provided to the die through power (Vdd) balls which are located in an inner most row of solder balls. Preferably, each power ball is effectively connected to a power ring on layer 1 of the package. By arranging the power balls in an inner most row, it is possible to reduce the distance the electrical signal has to travel to reach the power ring. Hence, a thick short trace may connect each power ball to a via which connects to the power ring on layer 1.

Preferably, ground is provided to the die through ground (Vss) balls which are dispersed in a ball field around the periphery of the inner most row of power balls. Preferably, the ground balls are paired together, because by pairing the ground balls, it is possible to use only one via for two ground balls on the system board. This reduces the number of layers needed on the system board to route all of the pins and may make it possible, for example, to route more traces on the system board.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic view showing a typical layout of ground balls, signal balls and power balls in a conventional four layer BGA package;

FIG. 2 is a schematic view of layer 1 of a four layer BGA package which is in accordance with an embodiment of the present invention;

FIG. 3 is a schematic view of layer 2 of a four layer BGA package which is in accordance with an embodiment of the present invention;

FIG. 4 is a schematic view of layer 3 of a four layer BGA package which is in accordance with an embodiment of the present invention; and FIG. 5 is a schematic view of layer 4 of a four layer BGA package which is in accordance with an embodiment of the present invention.

DESCRIPTION OF AN EMBODIMENT OF THE INVENTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIGS. 2–5 illustrate the four layers of a four layer ball grid array (BGA) package which is in accordance with an embodiment of the present invention. Specifically, FIG. 2 illustrates layer 1 of the package, FIG. 3 illustrates layer 2 of the package, FIG. 4 illustrates layer 3 of the package and FIG. 5 illustrates layer 4 of the package. As one having ordinary skill in the art would recognize, while layer 2 is disposed between layers 1 and 3 in the package, layer 3 is disposed between layers 2 and 4, and a die is disposed generally in the middle of the layers with several of the layer being wire bonded to the die.

As shown in FIG. 4, layer 3 of the package does not include a power plane, and instead provides signal traces 20. This is in contrast to prior art four layer BGA package designs which provide a power plane at layer 3. The embodiment shown in FIGS. 2–5 provides that no power layer needs to be provided on layer 3 due to the fact that power balls 22 are arranged in an inner most row 24 around the periphery 26 of a power plane 28 which is provided on layer 4 (see FIG. 5). By arranging the power balls 22 in an inner most row 24, it is possible to reduce the distance the electrical signal has to travel to reach a power ring 30 provided on layer 1 (see FIG. 2). In addition to providing that no power plane need be provided at layer 3, preferably layer 4 (see FIG. 5) provides ground balls 32 which are arranged in pairs. As such, the number of layers needed on the system board to route out all the pins can be reduced. Each of the four layers of the package will now be described in more detail, layer by layer.

As shown in FIG. 2, layer 1 of the package includes a plurality of signal traces 34 which communicate with signal vias 36. As shown, other signal vias 38 are provided on layer 1, and these are for providing connection to signal traces 20, 40 which are disposed on layers 3 and 4 (see FIGS. 4 and 5). A plurality of ground vias 42 are also provided on layer 1 for providing connection to the ground plane 44 which is provided by layer 2 (see FIG. 3) and ground traces 32 which are provided on layer 4 (see FIG. 5). In FIG. 2, ground vias are indicated with reference numeral 42 and power vias are indicated with reference numeral 46. Most of the vias which are not specifically identified with a reference numeral are signal vias.

As shown, layer 1 also includes a power ring 30 and a ground ring 50, both of which surround the die 52 which is disposed generally in the middle of the layer. Short thick traces connect power vias 46 to the power ring 30, and ground vias 42 to the ground ring 52. As shown in FIG. 2, layer 1 of the package may also include a partial ground plane 54 which is grounded to the system board.

As shown in FIG. 3, layer 2 of the package provides a ground plane 44. Preferably, the ground plane 44 is formed of a sheet of conductive material, such as copper. As shown, the ground plane 44 covers several ground vias 42 while leaving exposed several signal vias and power vias 46. In FIG. 3, all the power vias are indicated by reference numeral 46 while all the other exposed vias are signal vias 38. The power vias 46 are for providing connection of the power plane 28 on layer 4 (see FIG. 5) to the power ring 30 which is disposed on layer 1 (see FIG. 2). The signal vias 38 are for providing inter-connection of the various signal traces that are provided on the other three layers (see FIGS. 2, 4 and 5) of the package.

As shown in FIG. 4, layer 3 of the package includes a plurality of signal traces 20 which communicate with signal vias 38. As shown, other signal vias 36 are provided on layer 3, and these are for providing connection to signal traces 34, 40 which are disposed on layers 1 and 4 (see FIGS. 2 and 5). A plurality of ground vias 42 are also provided on layer 3 for providing connection to the ground plane 44 which is on layer 2 (see FIG. 3) and ground traces 32 which are provided on layer 4 (see FIG. 5). In FIG. 4, most of the vias which are not specifically identified with a reference numeral are signal vias.

As shown in FIG. 5, layer 4 provides a power plane 28. Preferably, the power plane 28 is formed of a sheet of conductive material, such as copper. FIG. 5 depicts two different sized circles dispersed throughout the layer. While the smaller circles in layer 4 represent vias, the larger circles represent BGA balls (i.e. power (Vdd) balls, ground (Vss) balls, and signal solder balls). Some of the power balls in FIG. 5 are identified by reference numeral 22 while some of the ground balls are identified by reference numeral 32. Most of the solder balls which are not specifically identified by a reference numeral are signal solder balls.

As shown in FIG. 5, the power plane 28 preferably leaves exposed several ground vias 42 and signal vias 60. Power balls 22 are arranged along a periphery 26 of the power plane 28, and ground balls 32 and signal balls 40 are arranged in a ball field 70 surrounding (or radially outward from) the power plane 28. Hence, the power balls 22 are arranged in an innermost row 24, while the ground balls 32 and signal balls 40 (which together from the ball field 70) are provided in a ball field 70 which effectively surrounds the innermost row 24 of power balls 22. By arranging the power balls 22 in an innermost row 24, the distance the electrical signal has to travel to reach the power ring 30 on layer 1 (see FIG. 2) is reduced. Additionally, the row 24 of power balls 22 need not be routed, and can be connected directly to the power plane 28. Hence, no power plane need be provided on layer 3 like in prior art four layer BGA package designs and layer 3 can instead be used for signal routing (see FIG. 4). The package provides that current flow is as follows:

Power ball (layer 4)→Trace/small (power) plane (layer 4)→
Power Via (layers 4, 3, 2, 1)→Power ring (layer 1)→Wirebond→Die This is in contrast to the current flow provided by prior art four layer BGA designs (where layer 3 provides a power plane):

Power ball (layer 4)→Trace (layer 4) 4 Power Via (layers 4, 3, 2, 1)→
Power plane (layer 3)→Power Via (layers 4, 3, 2, 1)→ Power ring (layer 1)→Wirebond→Die As shown in FIG. 5, preferably the ground balls 32 are arranged in pairs in the ball field 70, i.e. each ground ball 32 is next to another ground ball. By providing the ground balls 32 in such an arrangement, the number of layers needed on the system board to route out all the pins can be reduced. Additionally, it may be possible to route-more traces on the system board as a result of this ground ball arrangement.

While an embodiment of the present invention is shown and described, it is envisioned that those skilled in the art may devise various modifications of the present invention without departing from the spirit and scope of the appended claims.

The invention claimed is:

1. A ball grid array package comprising, a first layer, a second layer, a third layer and a fourth layer, said first layer comprising signal traces, said second layer comprising a ground plane, said third layer comprising signal traces, said fourth layer comprising a power plane and a ball field disposed generally radially outward from said power plane on said fourth layer, said ball field including ground balls and signal balls, but not including any power balls, said fourth layer including a plurality of power balls, wherein all of the power balls on said fourth layer are arranged along the periphery of the power plane such that the power balls are connected directly to the power plane, and wherein said second layer is disposed generally between said first layer and said third layer, and said third layer is disposed generally between said second layer and said fourth layer.

2. A ball grid array package as recited in claim 1, wherein said first layer further includes a power ring conductively connected to said power balls.

3. A ball grid array package as recited in claim 2, wherein said first layer includes short thick traces which conductively connect the power balls to the power ring.

4. A ball grid array package as recited in claim 2, wherein said first layer further includes a ground ring conductively connected to said ground plane on the second layer.

5. A ball grid array package as recited in claim 1, wherein said third layer does not include a power plane.

6. A ball grid array package as defined in claim 1, wherein said ball field includes a plurality of pairs of ground balls, wherein each pair of ground balls comprises one ground ball disposed generally next to another ground ball on the layer.

7. A ball grid array package comprising, a first layer, a second layer, a third layer, and a fourth layer, said first layer comprising signal traces, said second layer comprising a ground plane, said third layer comprising signal traces, and said fourth layer having a periphery, said fourth layer including a power plane having a periphery, wherein said fourth layer includes an area disposed between said periphery of said fourth layer and said periphery of said power plane, and wherein said area includes a ball field including a plurality of ground balls and a plurality of signal balls, but not including any power balls, wherein said second layer is disposed generally between said first layer and said third layer and said third layer is disposed generally between said second layer and said fourth layer.

8. A ball grid array package as defined in claim 7, further including power balls conductively contacting said power plane and disposed along the periphery of said power plane and wherein said first layer further includes a power ring conductively connected to said power balls.

9. A ball grid array package as defined in claim 7, wherein said first layer further includes a ground ring conductively connected to said ground plane on said second layer.

10. A ball grid array package as defined in claim 7, further including a plurality of power balls, conductively contacting said power plane and dispersed along the periphery of said power plane.

11. A ball grid array package as defined in claim 7, wherein said plurality of ground balls are conductively connected to said second layer through a plurality of ground vias, wherein each said ground ball is positioned proximate another said ground ball to form a pair of ground balls.

* * * * *